United States Patent [19]
Yuan et al.

[11] Patent Number: 6,008,519
[45] Date of Patent: Dec. 28, 1999

[54] VERTICAL TRANSISTOR AND METHOD

[75] Inventors: Han-Tzong Yuan; Donald L. Plumpton, both of Dallas; Jau-Yuann Yang, Richardson; Tae S. Kim, Dallas, all of Tex.

[73] Assignee: Texas Instruments Incorporated, Dallas, Tex.

[21] Appl. No.: 08/990,549

[22] Filed: Dec. 15, 1997

Related U.S. Application Data

[60] Provisional application No. 60/033,399, Dec. 16, 1996.

[51] Int. Cl.$^6$ .......................... H01L 29/76; H01L 29/80; H01L 29/74
[52] U.S. Cl. .......................... 257/329; 257/263; 257/266; 257/135
[58] Field of Search .......................... 257/60, 135, 136, 257/263, 264, 265, 266, 267, 302, 328, 329, 330, 331, 332, 333, 334, 279, 297; 438/173, 192, 193, 195

[56] References Cited

U.S. PATENT DOCUMENTS 5,468,661  11/1995  Yuan et al. .............. 438/193
5,747,842   5/1998  Plumton .................. 257/266

FOREIGN PATENT DOCUMENTS 363102271   5/1988  Japan .

Primary Examiner—Tom Thomas
Assistant Examiner—Hung Kim Vu
Attorney, Agent, or Firm—Christoper L. Maginniss; W. James Brady, III; Richard L. Donaldson

[57] ABSTRACT

A vertical transistor (70) comprising a first semiconductor layer (14) of a first conductive type. A gate structure (32) of a second conductive type disposed on the first semiconductor layer (14). The gate structure (32) may include a plurality of gates (38) separated by channels (40). A second semiconductor layer (50) of the first conductive type may be disposed over the gate structure (32) and in the channels (40). An arresting element (36) may be disposed between and upper surface of the gates (38) and the second semiconductor layer (50). A void (52) may be formed in the second semiconductor layer (50) over the gate (38).

15 Claims, 1 Drawing Sheet

VERTICAL TRANSISTOR AND METHOD

This application claims priority under 35 USC § 119(e)(1) of provisional application No. 60/033,399 filed Dec. 16, 1996.

The U.S. Government has rights in this invention pursuant to Contract No. N66001-91-C-6008.

TECHNICAL FIELD OF THE INVENTION

This invention relates generally to the field of electronic devices, and more particularly to an improved vertical channel field effect transistor and to a method of forming the same.

BACKGROUND OF THE INVENTION

Vertical channel field effect transistors (VFET) generally provide significantly improved switching efficiency as compared to DMOS, UMOS, or other power devices. Particularly, the vertical channel field effect transistors made out of GaAs material have an on-resistance per unit area that is five to eight times lower than state of the art silicon DMOS or UMOS power devices. In addition, GaAs vertical channel field effect transistors have excellent switching speed, on the order of 1 to 2 nanoseconds.

SUMMARY OF THE INVENTION

A need has arisen in the art for an improved vertical transistor. The present invention provides a vertical transistor that substantially eliminates or reduces the disadvantages and problems associated with prior vertical transistors.

In accordance with the present invention, a vertical transistor may comprise a first semiconductor layer of a first conductive type. A gate structure of a second conductive type may be disposed on the first semiconductor layer. The gate structure may include a plurality of gates separated by channels. A second semiconductor layer of the first conductive type may be disposed over the gate structure and in the channels. An arresting element may be disposed between an upper surface of the gates and the second semiconductor layer. A void may be formed in the second semiconductor layer over the gate.

More specifically, in accordance with one embodiment of the present invention, the first semiconductor layer, the gate structure and the second semiconductor layer may comprise gallium arsenide (GaAs). The arresting elements may comprise silicon dioxide ($SiO_2$) or silicon nitride ($Si_3N_4$). The first conductive type may be an n-type conductor. The second conductive type may be a p-type conductor.

In accordance with another aspect of the present invention, a low resistance element may be disposed between the arresting element and the upper surface of the gate. In one embodiment, the low resistance element may comprise tungsten silicide ($W_5Si_3$).

Important technical advantages of the present invention include providing a vertical transistor having reduced gate/source capacitance. In particular, voids may be formed above the gates to eliminate the vertical potential barrier of the gates. Accordingly, capacitance of the gates is reduced and less energy is required to operate the vertical transistor.

Another technical advantage of the present invention includes providing a vertical transistor having low gate resistance. In particular, a low resistance element may be provided at the upper surface of the gate to reduce resistance of the gate.

Still another technical advantage of the present invention includes providing a vertical transistor capable of high frequency switching of power devices. In particular, the combination of a low gate resistance and a low gate capacitance enables high frequency switching of power devices in the hundred megahertz to ten gigahertz range.

Other technical advantages will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

The preferred embodiments of the present invention and its advantages are best understood by referring now in more detail to FIGS. 1A–E of the drawings, in which like numerals refer to like parts throughout the several views. FIGS. 1A–E illustrate fabrication of a vertical transistor including a low resistance element disposed on the upper surface of the gate and a void formed above the gate. As described in more detail below, the low resistance elements reduce gate resistance of the vertical transistor. The voids reduce the gate/source capacitance of the vertical transistor.

Figure 1A:
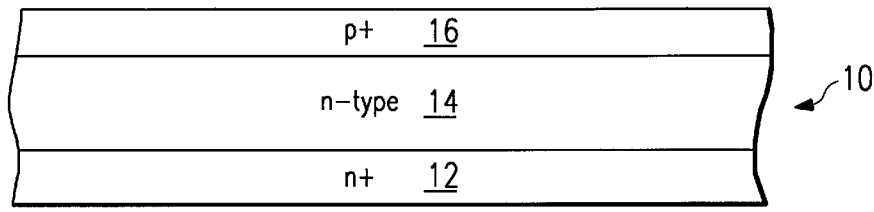
FIGS. 1A–E are a series of schematic cross-sectional diagrams illustrating fabrication of an improved vertical transistor in accordance with one embodiment of the present invention.

FIG. 1A illustrates an initial semiconductor structure 10 for constructing a vertical field effect transistor (VFET) in accordance with one embodiment of the present invention. The initial semiconductor structure 10 may have a substrate 12, a first semiconductor layer 14 and a gate layer 16. The substrate 12 may comprise III–V type semiconductor material. In one embodiment, the semiconductor material may be gallium arsenide (GaAs). It will be understood that the substrate 12 may comprise other types of semiconductor material within the scope of the present invention.

The substrate 12 may be of a first conductive type. In one embodiment, the first conductive type may be n-type semiconductor material. In this embodiment, the substrate 12 may be doped with an n-type dopant such as silicon, tin or antimony. The dopant level may generally be considered to be an n+. It will be understood that the dopant and the dopant level of the substrate 12 may vary within the scope of the present invention.

The first semiconductor layer 14 may be formed on the substrate 12. In one embodiment, the first semiconductor layer 14 may be an epitaxial drain (or source) layer deposited on the substrate 12. The thickness of the first semiconductor layer 14 is depended on the specific design of the vertical field effect transistor (VFET). In one embodiment, the first semiconductor layer 14 may have a thickness of 5,000 angstroms. It will be understood that the thickness of the first semiconductor layer 14 may vary within the scope of the present invention.

The first semiconductor layer 14 may comprise III–V type semiconductor material. In one embodiment, the semiconductor material may be gallium arsenide (GaAs). It will be understood that the first semiconductor layer 14 may comprise other types of semiconductor material within the scope of the present invention.

The first semiconductor layer 14 may be of the first conductive type. In one embodiment, the first conductive type may be n-type semiconductor material. In this embodiment, the first semiconductor layer 14 may be doped with an n-type dopant such as silicon. It will be understood that the dopant and the dopant level of the first semiconductor layer 14 may vary within the scope of the present invention.

The gate layer 16 may be formed on the first semiconductor layer 14. In one embodiment, the gate layer 16 may be an epitaxial layer deposited on the first semiconductor layer 14. The gate layer 16 may be 3,000 angstroms thick or thicker to reduce gate resistance. It will be understood that the thickness of the gate layer 16 may vary within the scope of the present invention.

The gate layer 16 may comprise III–V type semiconductor material. In one embodiment, the gate layer 16 may comprise gallium arsenide (GaAs). It will be understood that the gate layer 14 may comprise other types of semiconductor material within the scope of the present invention.

The gate layer 16 may be of a second conductive type. In one embodiment, the second conductive type may be p-type semiconductor material. In this embodiment, the gate layer 16 may be heavily doped with carbon to a concentration of about $10^{20} cm^{-3}$ or higher. Generally, the higher the dopant concentration the lower the gate resistance and the faster the switching of the transistor. It will be understood that the dopant level may vary within the scope of the present invention. For example, the gate layer 16 may be doped to a lower concentration such as $10^{18} cm^{-3}$.

Figure 1B:
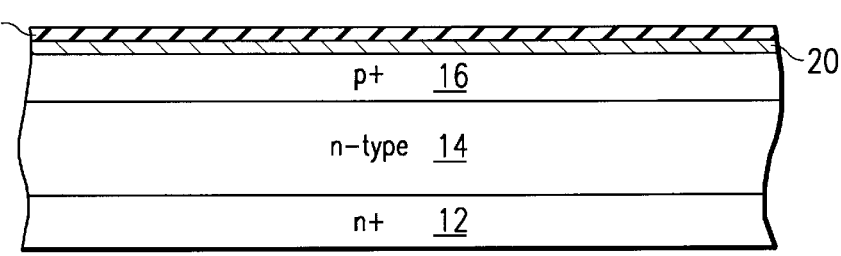

Referring to FIG. 1B, a low resistance layer 20 may be formed on the gate layer 16. As discussed in more detail below, low resistance elements made from the low resistance layer 20 may be disposed on an upper surface of transistor gates to lower the gate resistance. In one embodiment, the low resistance layer 20 may have a thickness of about 1,000 angstroms. It will be understood that the thickness of the low resistance layer 20 may vary within the scope of the present invention.

The low resistance layer 20 may comprise tungsten silicide ($W_5Si_3$). Tungsten silicide is thermally compatible with gallium arsenide (GaAs) in that it has a similar thermal expansion coefficient and will not dope the gallium arsenide (GaAs) during high temperature processing. It will be understood that the low resistance layer 20 may comprise other materials thermally compatible with the semiconductor material of the gate layer 16. For example, the low resistance layer 20 may comprise titanium tungsten (TiW), titanium tungsten nitride (TiWN), tungsten silicon nitride (WSiN), and the like.

An arresting layer 22 may be formed on the low resistance layer 20. As described in more detail below, arresting elements made from the arresting layer 22 may disassociate material during deposition of a second semiconductor layer to form voids over gates of the transistor. In one embodiment, the arresting layer 22 may have a thickness of about 500 angstroms. It will be understood that the thickness of the arresting layer 22 may vary within the scope of the present invention.

The arresting layer 22 may comprise silicon dioxide ($SiO_2$). It will be understood that the arresting layer 22 may comprise other materials capable of disassociating semiconductor material of a second semiconductor layer. For example, the arresting layer 22 may comprise silicon nitride ($Si_3N_4$) or other dielectric materials.

Figure 1C:
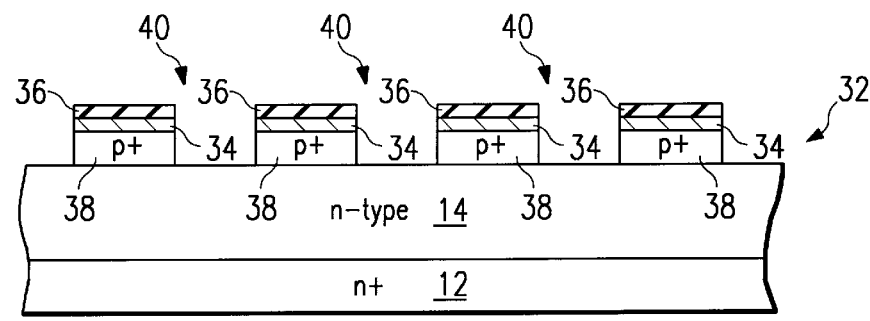

Referring to FIG. 1C, the gate layer 16, low resistance layer 20 and arresting layer 22 may be conventionally patterned and etched to define a gate structure 32, low resistance elements 34, and arresting elements 36. In one embodiment, the etch may be a conventional chlorine etch containing plasma, which is compatible with gallium arsenide (GaAs) semiconductor material. It will be understood that other types of etches compatible with the semiconductor material and capable of etching the low resistance layer 20, the arresting layer 22 and the gate layer 16 may be used within the scope of the present invention.

The gate structure 32 may comprise a plurality of gates 38 separated by channels 40. In one embodiment, the gates 38 may have a one (1) micron pitch with a channel opening of one-half (0.5) microns. It will be understood that the geometry of the gates 38 and the channels 40 may vary within the scope of the present invention.

The low resistance elements 34 may have a resistivity of about 100 micro ohms per centimeter as compared to about 1,000 micro ohms per centimeter for the gates 38. Accordingly, the low resistance elements 34 significantly lower the resistance of the gates 38. The arresting elements 36 are disposed on the low resistance elements 34. Accordingly, the arresting elements 36 are exposed to later semiconductor fabrication process and, as described in more detail below, may disassociate semiconductor material of a second semiconductor layer to form voids over the gates 38.

Figure 1D:
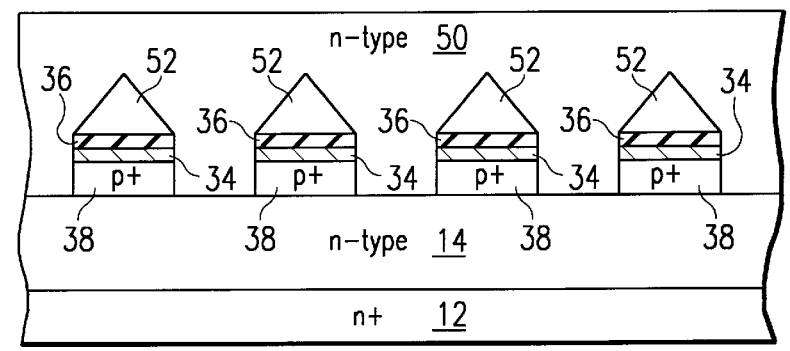

Referring to FIG. 1D, a second semiconductor layer 50 may be formed over the gate structure 32 and in the channels 40. In one embodiment, the second semiconductor layer 50 may be an epitaxial source (or drain) layer. The second semiconductor layer 50 may comprise III–V type semiconductor material. In one embodiment, the second semiconductor layer 50 may comprise gallium arsenide (GaAs). It will be understood that the second semiconductor layer 50 may comprise other types of semiconductor material within the scope of the present invention.

The second semiconductor layer 50 may be of the first conductive type. As previously described, the first conductive type may be n-type semiconductor material. In this embodiment, the second semiconductor layer 50 may be doped with an n-type dopant such as silicon. It will be understood that the dopant and the dopant level of the second semiconductor layer 50 may vary within the scope of the present invention.

With the arresting elements 36, the semiconductor material of the second semiconductor layer 80 may be selectively deposited on the gate structure 32 and in the channels 40. In one embodiment, the second semiconductor layer 50 may be selectively deposited using a conventional metal organic chemical vapor deposition (MOCVD) process. In this embodiment, semiconductor material of the second semiconductor layer 50 may join with exposed semiconductor material of the first semiconductor layer 14 to first fill the channels 40. The arresting elements 36 may disassociate the deposited semiconductor material to keep the top of the gates 38 free of the semiconductor material. After the channels 40 have been filled, further deposited semiconductor material may merge into a planarized layer with voids 52 formed over the gates 38. In one embodiment, the second semiconductor layer 50 may have a thickness of about 1 mm. It will be understood that the thickness of the second semiconductor layer 50 may vary within the scope of the present invention. As described in more detail below, the voids 52 reduce capacitance of the gates 38.

Figure 1E:
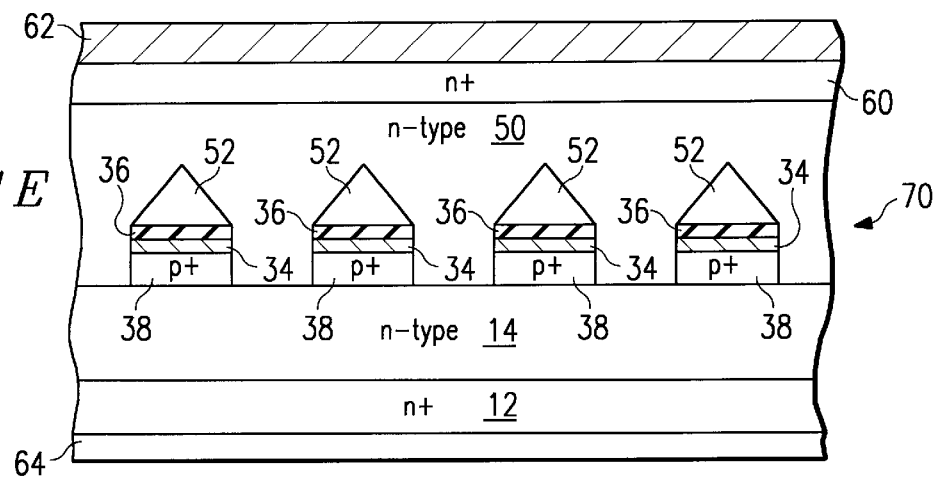

Referring to FIG. 1E, a cap layer 60 may be formed over the second semiconductor layer 50 to improve ohmic contact. In one embodiment, the cap layer 60 may have a thickness of 2,000 angstroms. It will be understood that the thickness of the cap layer 60 may vary within the scope of the present invention.

The cap layer 60 may comprise III–V type semiconductor material. In one embodiment, the cap layer 60 may comprise gallium arsenide (GaAs). It will be understood that the cap layer 60 may comprise other types of semiconductor material within the scope of the present invention.

The cap layer 60 may be of a first conductive type. As previously described, the first conductive type may be n-type semiconductor material. In this embodiment, the cap layer 60 may be doped with silicon to an n+ dopant level. It will be understood that the dopant and the dopant level may vary within the scope of the present invention.

A metal contact 62 for the second semiconductor layer 50 may be formed on the cap layer 60. In the absence of the cap layer 60, the contact 62 may be formed directly on the second semiconductor layer 50. In one embodiment, the metal contact 62 may have a thickness of about 4,000 angstroms. It will be understood that the thickness of the contact 62 may vary within the scope of the present invention.

The contact 62 may comprise non-alloyed PdGeIn, PdGe, or alloyed AuGeN, or InGaAs with TiPtAu or with tungsten silicon (WSi), or the like. The substrate 12 may be thinned and a metal contact 64 formed on the backside of the substrate 12. The contact 64 may be formed, as previously described, for the contact 62.

Contacts to the gate structure 32 may be formed by etching to a contact pad conventionally formed with the gate structure 32. Etching to the contact pad may eliminate overhead capacitance associated with implant contacts and remove any part of the arresting layer 22 formed over the contact pad. Further information concerning vertical field effect transistors may be found in U.S. Pat. No. 5,468,661, entitled "Method of Making Power VFET Device," issued Nov. 21, 1995 to Yuan, et al., which is hereby incorporated by reference.

The vertical effect transistor (VFET) 70 of the present invention operates conventionally by building a potential barrier around the gates to control current flow through the channels 40 between the gates 38. In accordance with the present invention, the voids 52 eliminate the vertical barrier above the gates 38 which are unnecessary for operation of the transistor 70. Accordingly, capacitance of the gates 38 is reduced by about one-third. As a result, less energy is required to operate the transistor 70. Additionally, the combination of low gate resistance due to the low resistance elements 34 and low capacitance due to the voids 52 enable high frequency switching of power devices in a range of about 100 MHz to 10 GHz.

Although the present invention has been described with several embodiments, various changes and modifications may be suggested to one skilled in the art. It is intended that the present invention encompass such changes and modifications as fall within the scope of the appended claims.

What is claimed is:

1. A vertical transistor, comprising:

a first semiconductor layer of a first conductive type;

a gate structure of a second conductive type disposed on the first semiconductor layer;

the gate structure including a plurality of gates separated by channels;

a second semiconductor layer of the first conductive type disposed over the gate structure and in the channels;

an arresting element disposed between an upper surface of the gate and the second semiconductor layer; and a void formed in the second semiconductor layer over the gate.

2. The vertical transistor of claim 1, wherein:

the first conductive type is a n-type conductor; and the second conductive type is a p-type conductor.

3. The vertical transistor of claim 1, wherein the first semiconductor layer is disposed on a substrate.

4. The vertical transistor of claim 1, the first semiconductor layer, the gate structure, and the second semiconductor layer further comprising III–V semiconductor material.

5. The vertical transistor of claim 1, the first semiconductor layer, the gate structure, and the second semiconductor layer further comprising gallium arsenide (GaAs).

6. The vertical transistor of claim 1, the arresting elements further comprising material selected from the group of silicon dioxide ($SiO_2$) and silicon nitride ($Si_3N_4$).

7. The vertical transistor of claim 1, further comprising a low resistance element disposed between the arresting element and the upper surface of the gate.

8. The vertical transistor of claim 7, the low resistance elements further comprising tungsten silicon ($W_5Si_3$).

9. The vertical transistor of claim 1, further comprising a metal element disposed between the arresting element and the upper surface of the gate.

10. The vertical transistor of claim 9, the metal elements further comprising tungsten silicon ($W_5Si_3$).

11. An integrated circuit, comprising:

a substrate of a first conductive type;

a first source/drain layer of the first conductive type;

a gate structure of a second conductive type disposed on the first source/drain layer;

the gate structure including a plurality of gates separated by channels;

a second source/drain layer of the first conductive type disposed over the gate structure and in the channels;

an arresting element disposed between an upper surface of the gate and the second source/drain layer; and a void formed in the second source/drain layer over the gate.

12. The integrated circuit of claim 11, wherein:

the first conductive type is an n-type conductor; and the second conductive type is a p-type conductor.

13. The integrated circuit of claim 11, the first source/drain layer, the gate structure, and the second source/drain layer further comprising III–V semiconductor material.

14. The integrated circuit of claim 11, the first source/drain layer, the gate structure, and the second source/drain layer further comprising gallium arsenide (GaAs).

15. The integrated circuit of claim 11, the arresting elements further comprising material selected from the group of silicon dioxide ($SiO_2$) and silicon nitride ($Si_3N_4$).

* * * * *